(12) United States Patent
Savary et al.

(10) Patent No.: US 9,774,335 B2
(45) Date of Patent: Sep. 26, 2017

(54) PHASE LOCKED LOOP CIRCUIT, INTEGRATED CIRCUIT, COMMUNICATION UNIT AND METHOD THEREFOR

(71) Applicant: Freescale Semiconductor, Inc., Austin, TX (US)

(72) Inventors: Pierre Savary, Muret (FR); Birama Goumballa, Larra (FR); Didier Salle, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/994,197

(22) Filed: Jan. 13, 2016

(65) Prior Publication Data

US 2017/0047933 A1 Feb. 16, 2017

(30) Foreign Application Priority Data

Aug. 13, 2015 (WO) ................... PCT/IB2015/001549

(51) Int. Cl.
*H03L 7/06* (2006.01)
*H03L 7/085* (2006.01)

(52) U.S. Cl.
CPC .................................... *H03L 7/085* (2013.01)

(58) Field of Classification Search
USPC ................. 327/146–147, 150, 155–156, 159
See application file for complete search history.

(56) References Cited

U.S. PATENT DOCUMENTS

| | | | | |
|---|---|---|---|---|
| 6,747,497 B2* | 6/2004 | Ingino, Jr. | ............ | H03K 3/0315 327/157 |
| 7,508,277 B2 | 3/2009 | Kuo et al. | | |
| 8,009,785 B2* | 8/2011 | Au | ........................ | H03L 7/0895 327/148 |
| 8,049,568 B2 | 11/2011 | Youssef et al. | | |
| 8,493,115 B2* | 7/2013 | Jang | ........................ | H03L 7/093 327/157 |
| 8,552,772 B2* | 10/2013 | Jovenin | .................... | H03L 7/093 327/146 |
| 8,624,628 B1* | 1/2014 | Chen | .............. | H03K 19/018521 326/80 |
| 9,401,723 B2* | 7/2016 | Montoriol | ............... | H03L 7/085 |
| 2008/0042722 A1* | 2/2008 | Dornbusch | .... | H03K 19/018514 327/333 |
| 2008/0111642 A1 | 5/2008 | Bohorquez | | |

* cited by examiner

*Primary Examiner* — An Luu

(57) ABSTRACT

A phase locked loop circuit includes a voltage controlled oscillator, VCO, configured to receive an oscillator tuning voltage; a phase detector configured to receive an input signal and a reference signal and generate a phase difference pulse signal that is varied in accordance with the oscillator tuning voltage; a loop filter having an input and an output; and a level shifter circuit coupled to an output of the phase detector and the loop filter input and configured to apply a level shift to the phase difference pulse signal such that the level shift is configured to compensate VCO gain and the loop filter averages the phase difference pulse signal to output an averaged signal to the VCO.

18 Claims, 3 Drawing Sheets

PHASE LOCKED LOOP CIRCUIT, INTEGRATED CIRCUIT, COMMUNICATION UNIT AND METHOD THEREFOR

FIELD OF THE INVENTION

The field of this invention relates to a phase locked loop circuit, an integrated circuit, a communication unit, and method therefor. The invention is applicable to, but not limited to, a mechanism for reducing or compensating for loop bandwidth variation in a phase locked loop (PLL) circuit of a communication unit, such as a radar device.

BACKGROUND OF THE INVENTION

Radar systems and radar devices typically utilize millimeter wave (MMW) frequencies for transmission and reception. The frequency generation circuits (sometimes referred to as synthesizers) of such radar devices typically comprise a phase detector and a voltage controlled oscillator (VCO), as part of a phase locked loop (PLL), which is responsible for the generation of the millimeter wave frequencies. Generally, voltage controlled oscillators operating at millimeter wave frequencies need to present a low phase noise, whilst providing a wide tuning range in order to cover the required modulation band (e.g. 1 GHz for Long-Range Radar (LRR) and 4 GHz for Short-Range Radar (SRR)). As such, VCO designs in radar applications are complex and suitable designs to meet all performance requirements are far from trivial.

Voltage controlled oscillators operating at millimeter wave frequencies generally suffer from center frequency variation over extreme corners and temperature conditions. Such center frequency variations tend to reduce the available tuning range of these VCOs, which can limit the modulation bandwidth, thereby resulting in increased manufacturing yield losses.

In a typical PLL, the VCO exhibits a frequency variation across the frequency-tuning voltage ($V_{tune}$) applied to the VCO. The gain of the VCO is the derivative of the frequency vs. $V_{tune}$. Changes to the VCO gain impacts the gain of the loop, and thus, in effect, the loop bandwidth varies with the VCO gain. Other loop parameters, such as stability margin, rejection of the spurious tone created by the reference frequency of the PLL, response time, phase noise, etc., are also affected by any variation of the VCO parameters with $V_{tune}$. As a consequence, PLL designs typically need to optimize the loop stability for the worst-case VCO performance, which leads to a degraded phase noise and a poorer PLL response time.

U.S. Pat. No. 7,508,277 B2 describes a phase locked loop with VCO tuning sensitivity compensation. In U.S. Pat. No. 7,508,277 B2, phase detector gain is tuned step-wise by adapting the phase detector bias current through a feedback loop function of $V_{tune}$. Thus, the $V_{tune}$ voltage that forms the input of the feedback loop needs to be measured, and this is likely to degrade the phase noise of the VCO in most practical scenarios. Furthermore, it is known that such methods of adjusting the gain of the phase detector to control the loop bandwidth of a PLL result in a relatively complicated design.

US 20080111642 A1 describes an apparatus and method for VCO linearization where the VCO gain is linearized at the expense of the VCO tuning range. This proposed design requires use of low-noise bias voltages, which makes the design complex.

BRIEF DESCRIPTION OF THE DRAWINGS

The present invention may be understood, and its numerous objects, features and advantages obtained, when the following detailed description of a preferred embodiment is considered in conjunction with the following drawings. In the drawings, like reference numbers are used to identify like or functionally similar elements. Elements in the figures are illustrated for simplicity and clarity and have not necessarily been drawn to scale.

DETAILED DESCRIPTION

Figure 1:
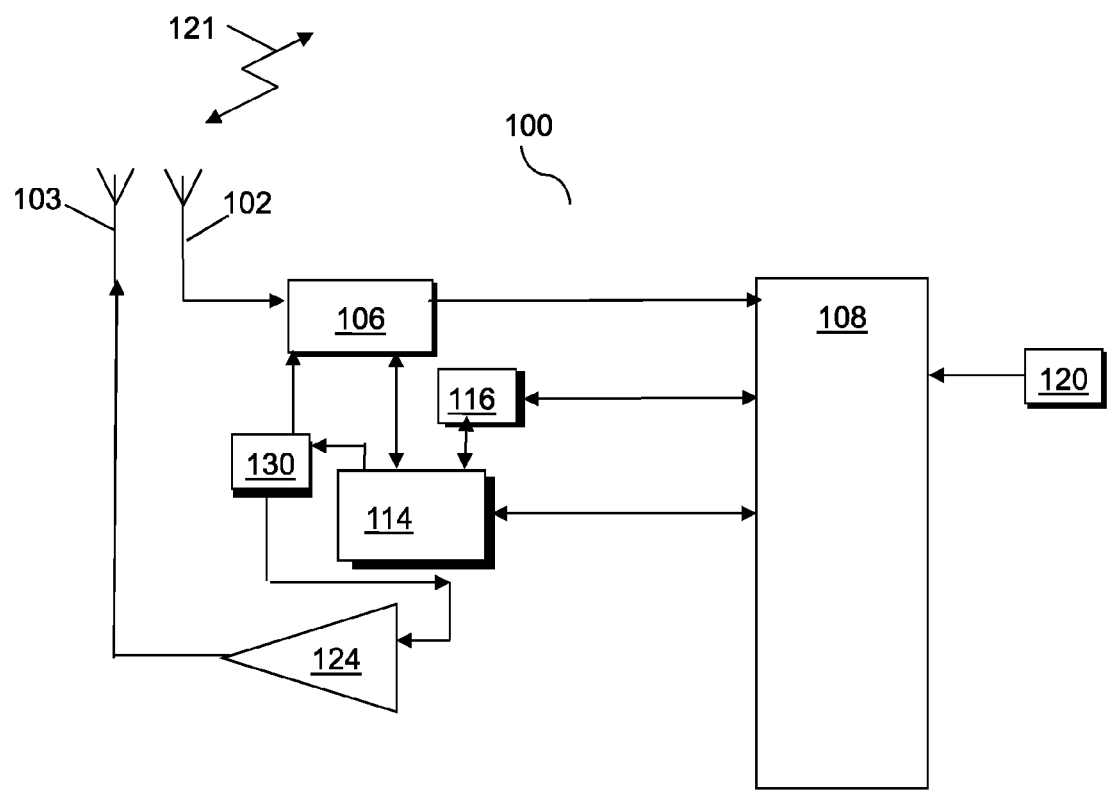
FIG. 1 illustrates an example block diagram of a radar device.

Although examples of the invention are described with reference to a VCO and PLL design for a radar device, the concepts herein described may be applied to any wireless communication unit, and are thus not limited to the specific components or circuits or architecture of FIG. 1 or FIG. 2. Furthermore, examples of this invention may be applied to any system that converts a phase difference of two signals into voltage (e.g., an oversampling digital to analog converter (DAC) with a reconstruction filter). Although examples of the invention are described with reference to a first order PLL design that generates an output voltage, it is envisaged that the concepts herein described may be applied to any order of PLL, e.g. a second order PLL (using a phase frequency detector), where the PLL generates an output current.

In examples of the invention, a phase locked loop circuit includes a voltage controlled oscillator (VCO) configured to receive an oscillator frequency tuning voltage, a phase detector configured to receive an input signal and a reference signal and generate a phase difference pulse signal that is varied in accordance with the oscillator tuning voltage; and a loop filter having an input and an output. A level shifter circuit is coupled to an output of the phase detector and to the loop filter input and configured to apply a level shift to the phase difference pulse signal such that the level shift is configured to compensate VCO gain and the loop filter averages the phase difference pulse signal to provide an averaged signal to the VCO.

The introduction of a level shifter circuit associated with the loop filter and located after a PLL phase detector effectively generates a variable phase detector gain that can be configured to compensate the variable VCO gain. The phase detector gain may be configured to vary in a complementary manner (e.g. opposing direction and value) to the VCO gain, such that the product of the phase detector gain and VCO gain can be maintained relatively constant. A relatively constant phase detector gain and VCO gain product helps to reduce or compensate for loop bandwidth variation as the PLL loop bandwidth is proportional to the product of the phase detector gain and the VCO gain. Thus, in some examples, PLL performance may be improved, such as loop stability margin, PLL phase noise variation, rejection of spurious tones due to the PLL reference frequency, etc.

In some examples, a level shift is applied to the phase difference pulse signal such that the phase difference pulse signal that is level shifted by the level shifter circuit approaches or reaches a maximum oscillator tuning voltage for 100% output duty cycle ($V_{tune}$), thereby allowing a maximum VCO frequency tuning range to address wide frequency range applications.

In some examples, a first order PLL may be used. In first order PLL examples, an exclusive-OR (XOR) based phase detector may be used with the level shifter circuit and the loop filter to generate a phase difference pulse signal that is varied in accordance with the oscillator tuning voltage. As both the XOR based phase detector and the level shifter circuit provide output voltages, the level shifter circuit is able to provide a variable gain (associated with the loop filter) that compensates the VCO gain.

A level shift applied to the phase difference pulse signal may be configured to compensate VCO gain such that the averaged signal provided by the loop filter to the VCO is able to compensate for the tuning sensitivity of the VCO. The loop filter averages the output of the XOR based phase detector, and thus transforms an input pulse signal into an averaged signal to drive a VCO frequency tuning port. In this manner, the level shifter circuit compensates the VCO gain variation, whilst the VCO input impedance creates a phase variation.

Although examples of the invention are described with reference to a common-emitter npn transistor being used as part of a level shifter circuit, it is envisaged that in other examples, the common-emitter npn transistor may be replaced by other level shifter circuits or components, for example a nmos transistor in a FET-based design.

Various illustrative embodiments of the present invention will now be described in detail below with reference to the Figures.

Referring to FIG. 1, a block diagram of a wireless communication unit, adapted in accordance with some examples, is shown. Purely for explanatory purposes, the wireless communication unit is described in terms of a radar device 100 operating at MMW frequencies. The radar device 100 contains one or several antennas 102 for receiving radar signals 121, and one or several antennas 103 for transmitting radar signals, with one shown for each for simplicity reasons only. The number of antennas 102, 103 used depends on the number of radar receiver and transmitter channels implemented in a given radar device. One or more receiver chains, as known in the art, include receiver front-end circuitry 106, effectively providing reception, frequency conversion, filtering and intermediate or base-band amplification, and finally an analog to digital conversion. In some examples, such circuits or components may reside in signal processing module 108, dependent upon the specific selected architecture. The receiver front-end circuitry 106 is coupled to a signal processing module 108 (generally realized by a digital signal processor (DSP)). A skilled artisan will appreciate that the level of integration of receiver circuits or components may be, in some instances, implementation-dependent.

The controller 114 maintains overall operational control of the radar device 100, and in some examples may comprise time-based digital functions (not shown) to control the timing of operations (e.g. transmission or reception of time-dependent signals, FMCW modulation generation, etc.) within the radar device 100. The controller 114 is also coupled to the receiver front-end circuitry 106 and the signal processing module 108. In some examples, the controller 114 is also coupled to a memory device 116 that selectively stores operating regimes, such as decoding/encoding functions, and the like.

As regards the transmit chain, this essentially comprises a power amplifier 124 coupled to the transmitter's one or several antennas 103, antenna array, or plurality of antennas. The transmitter comprises a power amplifier (PA) 124 and frequency generation circuit 130 that are both operationally responsive to the controller 114.

A single processor may be used to implement a processing of receive signals, as shown in FIG. 1. Clearly, the various components within the radar device 100 can be realized in discrete or integrated component form, with an ultimate structure therefore being an application-specific or design selection.

A skilled artisan will appreciate that the level of integration of circuits or components may be, in some instances, implementation-dependent.

In radar device 100, radar transceiver topology is different from traditional wireless communication architectures (e.g. Bluetooth™, WiFi™, etc.), as modulation occurs within a phase locked loop (PLL) (typically via a fractional-N divider), and is applied directly to the PA 124. Therefore, in some examples, the receiver front-end circuitry 106 and transmitter PA 124 are coupled to frequency generation circuit 130 that comprises a voltage controlled oscillator (VCO) circuit and PLL (and in some examples a fractional-N divider (not shown)) arranged to provide local oscillator signals. The generated local oscillator signals are thus modulated directly for transmit radar signals, and also used to down-convert received modulated radar signals to a final intermediate or baseband frequency or digital signal for processing in a receive operation.

Figure 2:
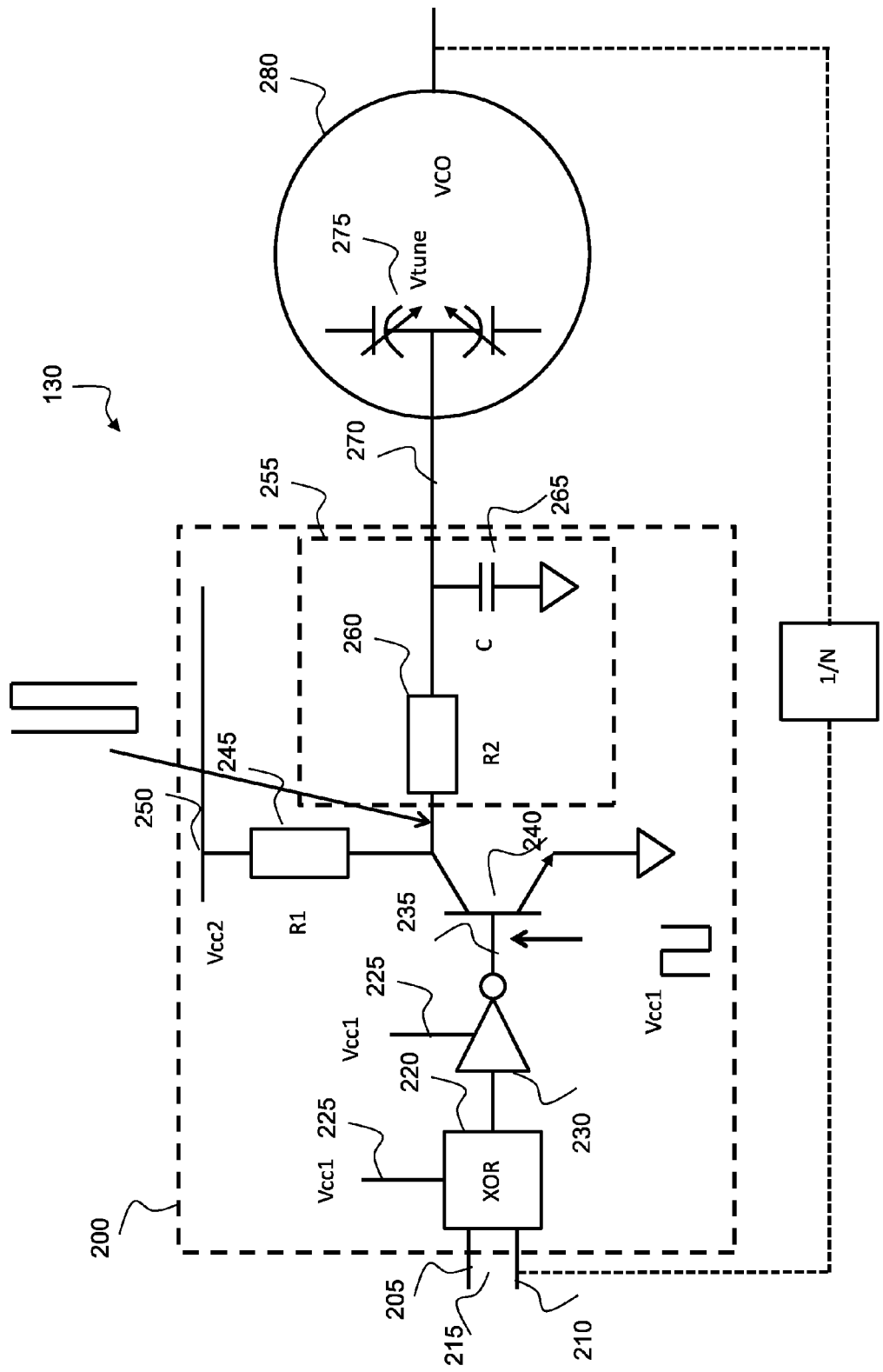
FIG. 2 illustrates an example VCO and PLL design for a radar device, in accordance with selected embodiments of the present disclosure.

Referring to FIG. 2, an example frequency generation circuit 130 includes a VCO and PLL design for a radar device. In one example, FIG. 2 illustrates a simplified example representation of an integrated circuit (IC) 200 comprising a phase detector that can be coupled to a VCO as part of a PLL, which can be employed in the radar device of FIG. 1. In this example, the VCO and PLL feedback path are shown as external to the IC 200. In other examples, one or more of the VCO and PLL feedback path may form part of the IC 200. In other examples, the phase detector and associated components and circuits of FIG. 2 may be implemented as discrete elements, and thus not implemented on an IC.

Figure 3:
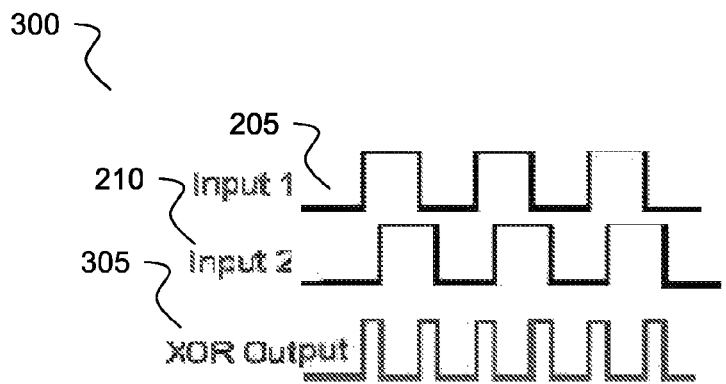
FIG. 3 illustrates an example timing diagram for an XOR-based phase detector for a PLL in accordance with selected embodiments of the present disclosure.

In this example, the phase detector includes an exclusive 'OR' (XOR) gate 220 having an input phase locked loop (PLL) feedback signal 210 and reference frequency input signal 205, as illustrated in FIG. 3. FIG. 3 illustrates an example timing diagram 300 for an XOR-based phase detector for a PLL, whereby the input PLL feedback signal 210 has a timing offset with the reference frequency input signal 205. The resultant timing waveform 305 output from the XOR-based phase detector is, thus, a pulse-based output at twice the frequency of the reference frequency input signal 205, as shown.

Referring back to FIG. 2, the XOR gate 220 phase detector (or phase comparator in other examples) used within the PLL is supplied with a first supply voltage (Vcc1) 225, which regulates the output voltage phase difference pulse signals between 0V and Vcc1 225. When there is a phase difference 215 between the frequency input signal 205 and PLL feedback signal 210, the XOR gate 220 generates a phase difference pulse signal, e.g. a pulse voltage signal with a pulse duty cycle that changes with the phase difference 215. Consequently, due to the PLL feedback signal 210, the phase difference 215 is dependent upon the oscillator tuning voltage ($V_{tune}$) 270.

In a classic PLL design, the loop filter converts the change in the duty cycle into a voltage by averaging the pulse input signal. In a classic PLL design, the conversion is linear (for example when a resistance of R1=0 is placed in equation [1] below, leading to: $V_{tune}=V_{cc}*phase/\pi$).

However, in contrast to a classic PLL design, examples of the present invention propose that the conversion is specifically configured to be non-linear in nature. In this example, the non-linear conversion is achieved by adding a level shifter to the output of an XOR based phase detector, which in this example includes a common-emitter npn transistor 240 driven by a second supply voltage Vcc2 250 plus first resistor (R1) 245. As the level shifter circuit actually inverts the output error pulses (either constant or varying), the input 235 to the level shifter circuit is first input to an inverter 230, which pre-compensates for the pulse inversion caused by the level shifter circuit.

In some examples, the combination of the phase detector gain ($K_p$) together with the controllable, variable gain shift from the level shifter circuit, is configured to be non-linear, i.e. a non-linear $V_{tune}$ 270 vs. variation of phase difference between the XOR inputs. In this manner, the non-linear phase detector gain ($K_p$) together with the controllable, variable gain shift from the level shifter circuit can be configured to compensate for the VCO variable gain as the VCO gain varies with $V_{tune}$.

In examples, the output of the common-emitter npn transistor 240 (or in other examples an output of a common-source transistor), which is configured to provide a non-linear level-shift operation of the phase difference pulse signal, is also coupled to a second resistor (R2) 260 and a capacitive element (C) 265 configured to form a low-pass filter. The low-pass filter averages the pulse signal in order to provide an averaged voltage to the VCO.

With a suitable choice of component values for first resistor R1 245, second resistor R2 260 and capacitive element C 265, this illustrated example topology, when coupled to VCO 280, provides a relatively constant gain ($K_p*K_v$) product, where $K_v$ is the tuning sensitivity of the VCO in radians per second per volt. The relatively constant gain ($K_p*K_v$) product results in a more stable and controllable bandwidth for the PLL, as the PLL bandwidth is related to the $k_p*k_v$ product, and if the product is constant, the bandwidth is constant.

Thus, $V_{tune}$ 270 may be varied, with the voltage level depending on Vcc2, first resistor R1 245, phase difference changes at the input of the XOR based phase detector, and second resistor R2 260. In this example, the value for $V_{tune}$ 270 may be determined as shown in equation [1]:

$$Vtune \approx Vcc2 \times \frac{\frac{R2}{R1+R2} \times \frac{\text{phase\_difference}}{p}}{1 - \frac{R1}{R1+R2} \times \frac{\text{phase\_difference}}{p}} \quad [1]$$

In this manner, a simple PLL loop bandwidth compensation for gain variations can be achieved in a small component or die area. The VCO gain compensation may be achieved by adding only a logic inverter that pre-compensates for the pulse inversion caused by the level shifter circuit, a transistor and a resistive element, as compared to a classic linear XOR-based PLL. A suitable selection of the (additional) resistive element value facilitates tuning the compensation. Advantageously, examples do not use any additional feedback loop to correct the variable VCO gain depending on $V_{tune}$ value (as proposed in U.S. Pat. No. 7,508,277 B2 for example), and thus there is no delayed response time to implement the compensation. Such an approach facilitates PLL use with a fast modulation, which known XOR-based PLLs struggle with as any compensation response time depends on the feedback loop, which includes the loop filter 255 and associated delays.

In some examples, suitable (or optimum) component values for first resistor R1 245, second resistor R2 260 and capacitive element C 265 may be selected in order to fit a typical gain curve of the VCO. Thus, in one example, these component values are selected such that there is no temperature variation effect or any subsequent part-to-part adjustment needed as the VCO's operation is repeatable throughout its operating frequency range. In this respect this example does not present an adaptive system that would select the best component values for any given case.

Figure 4:
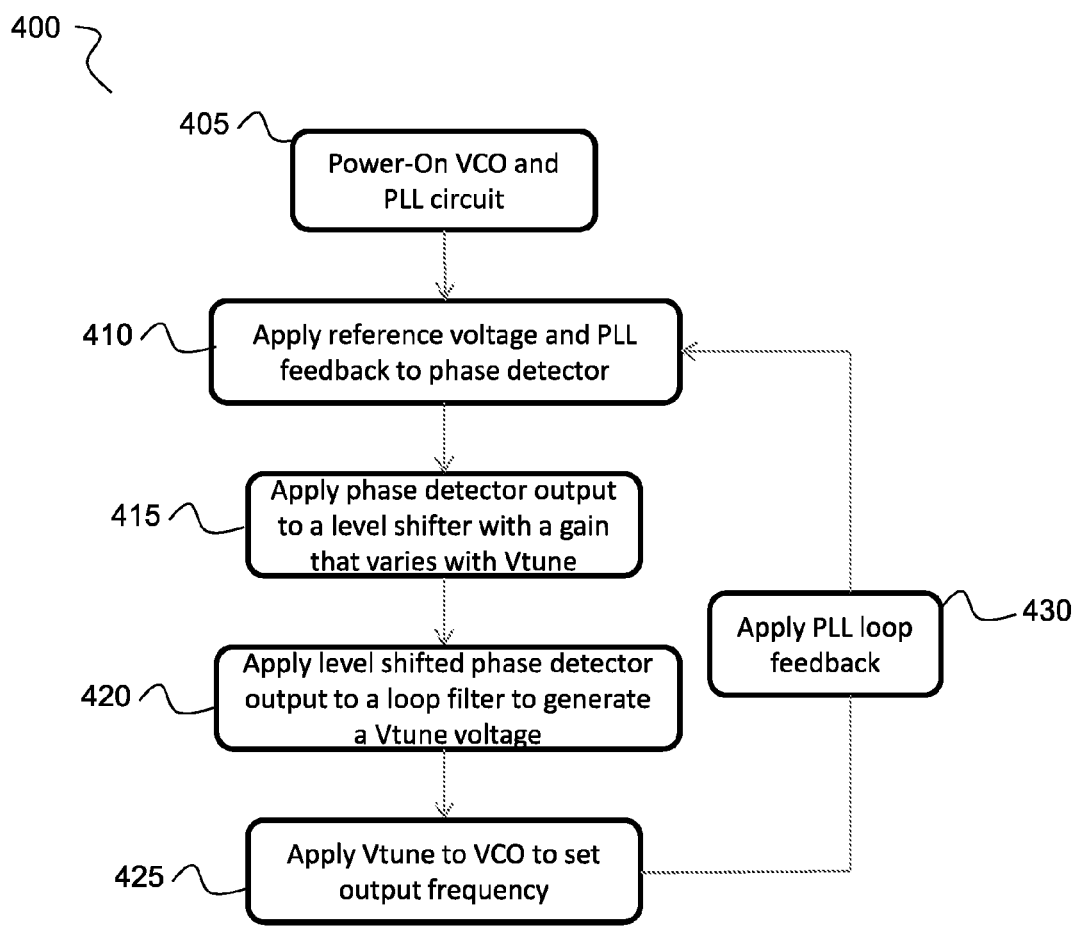
FIG. 4 illustrates a simplified flowchart of an example of an operation of a VCO and PLL design for a radar device in accordance with selected embodiments of the present disclosure.

FIG. 4 illustrates a simplified flowchart of an example of an operation of a VCO and PLL design for a radar device. The flowchart 400 starts at 405 with the VCO and PLL circuit being powered on. A reference voltage and a PLL feedback signal are applied to a phase detector, for example an XOR-based phase detector, in 410. In 415, the XOR-based phase detector is applied to a level shifter with a gain that varies with $V_{time}$. In 420, the level shifted XOR-based phase detector output is applied to a loop filter to generate a $V_{tune}$ voltage. $V_{tune}$ is then applied to the VCO to set the VCO output frequency in 425. An output of the VCO is applied to the input, as at 410, via a feedback path to form a PLL in 430.

Applicants have determined that a need exists for improved reduction or compensation for loop bandwidth variation to overcome the problems in the art, such as outlined above, though further limitations and disadvantages of conventional technologies will become apparent to one of skill in the art after reviewing the remainder of the present application. By now it should be appreciated that there has been provided a PLL circuit, an integrated circuit, a wireless communication unit and a method of compensating in a phase locked loop.

In the disclosed circuits, a phase locked loop, PLL, circuit comprises: a voltage controlled oscillator, VCO, configured to receive an oscillator tuning voltage; a phase detector configured to receive an input signal and a reference signal and generate a phase difference pulse signal that is varied in accordance with the oscillator tuning voltage; a loop filter having an input and an output; and a level shifter circuit coupled to an output of the phase detector and the loop filter input and configured to apply a level shift to the phase difference pulse signal such that the level shift is configured to compensate VCO gain and the loop filter averages the phase difference pulse signal to output an averaged signal to the VCO.

In this manner, the introduction of a level shifter circuit coupled to the loop filter and located after a PLL phase detector effectively generates a variable phase detector gain that can be configured to compensate the variable VCO gain. The phase detector gain may be configured to vary in a complementary manner (e.g. opposing direction and value) to the VCO gain, such that the product of the phase detector gain and VCO gain can be maintained relatively constant. A relatively constant phase detector gain and VCO gain product helps to reduce or compensate for loop bandwidth variation as the PLL loop bandwidth is proportional to the product of the phase detector gain and the VCO gain. Thus, in some examples, PLL performance may be improved, such as loop stability margin, PLL phase noise variation, rejection of spurious tones due to the PLL reference frequency, etc.

In selected embodiments, the level shifter circuit is coupled to the loop filter and phase detector and configured to convert in a non-linear manner a change in a duty cycle of the phase difference pulse signal into the averaged signal provided to the VCO.

In selected embodiments, the level shifter circuit is coupled to the loop filter and phase detector and configured to generate a variable phase detector gain that compensates a variable VCO gain such that a product of the variable phase detector gain and variable VCO gain is relatively constant. In selected embodiments, the level shifter circuit may apply a level shift such that the phase difference pulse signal approaches or reaches a maximum oscillator tuning voltage for 100% duty cycle ($V_{tune}$). In selected embodiments, the phase detector may be an exclusive-OR (XOR) circuit in a first order PLL.

In selected embodiments, the level shifter circuit may comprise a transistor coupled to a resistive divider configured to set a level shift to be applied to the phase difference pulse signal. In selected embodiments, at least one resistive element of the resistive divider may be coupled to at least one capacitive element to form a loop filter input to the VCO, thereby providing averaged VCO phase compensation. In selected embodiments, the transistor may be a common emitter transistor stage switched by the phase difference pulse signal output from the phase detector and at least one resistive element of the resistive divider may be coupled to a collector port of the common emitter transistor stage. In selected embodiments, the transistor may be a common source transistor stage switched by the phase difference pulse signal output from the phase detector and at least one resistive element of the resistive divider may be coupled to a drain port of the common source transistor stage.

In addition, there is a disclosed integrated circuit for a phase locked loop comprising: a phase detector configured to receive an input signal and a reference signal and generate a phase difference pulse signal that is varied in accordance with an oscillator tuning voltage; and a loop filter having an input and an output; and a level shifter circuit coupled to an output of the phase detector and the loop filter input and configured to apply a level shift to the phase difference pulse signal such that the level shift is configured to compensate VCO gain and the loop filter averages the phase difference pulse signal to output provides an averaged signal to the VCO.

In another form, a communication unit, such as a radar device, has been described and includes a phase locked loop circuit comprising: a voltage controlled oscillator, VCO, configured to receive an oscillator tuning voltage; a phase detector configured to receive an input signal and a reference signal and generate a phase difference pulse signal that is varied in accordance with the oscillator tuning voltage; a loop filter having an input and an output; and a level shifter circuit coupled to an output of the phase detector and the loop filter input and configured to apply a level shift to the phase difference pulse signal such that the level shift is configured to compensate VCO gain and the loop filter averages the phase difference pulse signal to output provides an averaged signal to the VCO.

In yet another form, a method of compensating in a phase locked loop, PLL, is described. The method comprises: applying a reference voltage and a PLL feedback signal to a phase detector; outputting from the phase detector a phase difference pulse signal that is varied in accordance with the oscillator tuning voltage to a level shifter; and inputting, to a voltage controlled oscillator, VCO, a level shifted representation of the phase difference pulse signal such that the level shift is configured to compensate VCO gain; averaging by a loop filter the phase difference pulse signal to output an averaged signal to the VCO.

In some examples, the level shifter circuit may comprise a transistor including an output coupled to a level shift arrangement configured to level shift in a non-linear manner the phase difference pulse signal. In some examples, the level shift arrangement comprises at least one resistive element coupled to at least one capacitive element to form a loop filter input to the VCO, thereby providing continuous VCO phase compensation.

Although examples have been described with reference to an exclusive-OR (XOR) gate as the phase detector in a PLL, it is envisaged that other examples may use alternative phase detector components, modules or circuits. Furthermore, although examples have been described with reference to an exclusive-OR (XOR) gate, it is envisaged that other components, modules or circuits may be used as an equivalent to an XOR gate, for example a combination of logic devices or a programmable device with multiple inputs and a single output. In some example embodiments, the XOR gate function may be implemented using different logic type as Complementary metal-oxide-semiconductor (CMOS), emitter-coupled logic (ECL) that is part of a high-speed integrated circuit bipolar transistor logic family, Current mode logic (CML), etc. Depending on frequency operation, appropriate logic type could be used to realize the XOR gate function.

In example embodiments, the concepts described herein may be applied to any circuit that generates a pulse width that is proportional to a phase difference of the input signals, or after filtering, where a voltage is generated that is proportional to a phase difference between the input signals.

Examples have been described with reference to use of a npn common-emitter transistor stage between the phase detector and the VCO as part of a PLL, where the transistor stage is switched by the phase difference pulse signal generated by the phase detector and at least one resistive element of a level shift circuit is coupled to a collector port. However, it is envisaged that other examples may use alternative transistor stages components, modules or circuits, for example a nmos transistor stage switched by the phase detector tunable voltage output with the resistive element being coupled to a drain port.

Although examples have been described with reference to use of a two-resistor level shifting circuit followed by a simple R-C filter, it is envisaged that other examples may use alternative level-shifting and filtering components, modules or circuits.

Although the described exemplary embodiments disclosed herein are directed to hardware-based circuits and methods and communication units for compensating in a phase locked loop, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on an integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Also, the use of phrases such as 'or' within the description can be interpreted either exclusively or inclusively, depending upon which is broader in terms of the context described. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A phase locked loop, PLL, circuit comprising:
a voltage controlled oscillator, VCO, configured to receive an oscillator tuning voltage;

a phase detector configured to receive an input signal and a reference signal and generate a phase difference pulse signal that is varied in accordance with the oscillator tuning voltage;
a loop filter having an input and an output;
a level shifter circuit coupled to an output of the phase detector and the loop filter input and configured to apply a level shift to the phase difference pulse signal such that the level shift is configured to compensate VCO gain and the loop filter averages the phase difference pulse signal to output an averaged signal to the VCO; and
a logic inverter coupled to an output of the phase detector and an input of the level shifter circuit and configured to pre-compensate for a pulse inversion caused by the level shifter circuit;
wherein the level shifter comprises a transistor coupled to a resistive divider configured to set the level shift to be applied to the phase difference pulse signal.

2. The phase locked loop circuit of claim 1, wherein the level shifter circuit is configured to convert in a non-linear manner a change in a duty cycle of the phase difference pulse signal into the averaged signal to the VCO.

3. The phase locked loop circuit of claim 1, wherein the level shifter circuit is configured to generate a variable phase detector gain that compensates a variable VCO gain such that a product of the variable phase detector gain and variable VCO gain is constant.

4. The phase locked loop circuit of claim 1, wherein the level shifter circuit applies a level shift such that the phase difference pulse signal approaches or reaches a maximum oscillator tuning voltage ($V_{tune}$).

5. The phase locked loop circuit of claim 1, wherein the phase detector is an exclusive-OR circuit in a first order PLL.

6. The phase locked loop circuit of claim 1, wherein at least one resistive element of the resistive divider is coupled to at least one capacitive element to form a loop filter input to the VCO, thereby providing continuous VCO frequency tuning voltage.

7. The phase locked loop circuit of claim 1, wherein the transistor is a common emitter transistor stage switched by the phase difference pulse signal output from the phase detector and at least one resistive element of the resistive divider is coupled to a collector port of the common emitter transistor stage.

8. The phase locked loop circuit of claim 1, wherein the transistor is a common source transistor stage switched by the phase difference pulse signal output from the phase detector and at least one resistive element of the resistive divider is coupled to a drain port of the common source transistor stage.

9. A phase locked loop, PLL, circuit comprising:
a voltage controlled oscillator, VCO, configured to receive an oscillator tuning voltage;
a phase detector configured to receive an input signal and a reference signal and generate a phase difference pulse signal that is varied in accordance with the oscillator tuning voltage;
a loop filter having an input and an output; and
a level shifter circuit coupled to an output of the phase detector and the loop filter input and configured to apply a level shift to the phase difference pulse signal such that the level shift is configured to compensate VCO gain and the loop filter averages the phase difference pulse signal to output an averaged signal to the VCO;

wherein the level shifter circuit comprises a transistor coupled to a resistive divider configured to set the level shift to be applied to the phase difference pulse signal; and
wherein the transistor is provided with a supply voltage, Vcc2, via a first resistive element, R1, of the resistive divider, the phase detector includes two inputs with a phase difference there between, and a transistor output to the VCO is provided via a second resistive element, R2, of the resistive divider, such that an oscillator tuning voltage, $V_{tune}$, is given by:

$$Vtune \approx Vcc2 \times \dfrac{\dfrac{R2}{R1+R2} \times \dfrac{\text{phase\_difference}}{\pi}}{1 - \dfrac{R1}{R1+R2} \times \dfrac{\text{phase\_difference}}{\pi}}.$$

10. An integrated circuit for a phase locked loop, PLL, comprising:
a phase detector configured to receive an input signal and a reference signal and generate a phase difference pulse signal that is varied in accordance with an oscillator tuning voltage; and
a loop filter having an input and an output;
a level shifter circuit coupled to an output of the phase detector and the loop filter input and configured to apply a level shift to the phase difference pulse signal such that the level shift is configured to compensate voltage controlled oscillator, VCO, gain and the loop filter averages the phase difference pulse signal to output an averaged signal to a VCO; and
a logic inverter coupled to an output of the phase detector and an input of the level shifter circuit and configured to pre-compensate for a pulse inversion caused by the level shifter circuit;
wherein the level shifter circuit comprises a transistor coupled to a resistive divider configured to set the level shift to be applied to the phase difference pulse signal.

11. The integrated circuit of claim 10, wherein the level shifter circuit is configured to convert in a non-linear manner a change in a duty cycle of the phase difference pulse signal into the averaged signal to the VCO.

12. The integrated circuit of claim 10, wherein the level shifter circuit is coupled to the loop filter and phase detector and configured to generate a variable phase detector gain that compensates a variable VCO gain such that a product of the variable phase detector gain and variable VCO gain is constant.

13. The integrated circuit of claim 10, wherein the level shifter circuit applies a level shift such that the phase difference pulse signal approaches or reaches a maximum oscillator tuning voltage, $V_{tune}$.

14. The integrated circuit of claim 10, wherein the phase detector is an exclusive-OR circuit in a first order PLL.

15. The integrated circuit of claim 10, wherein at least one resistive element of the resistive divider is coupled to at least one capacitive element to form a loop filter input to the VCO, thereby providing continuous VCO frequency tuning voltage.

16. The integrated circuit of claim 10, wherein the transistor is a common emitter transistor stage switched by the phase difference pulse signal output from the phase detector and at least one resistive element of the resistive divider is coupled to a collector port of the common emitter transistor stage.

17. A communication unit including a phase locked loop circuit comprising:
- a voltage controlled oscillator, VCO, configured to receive an oscillator tuning voltage;
- a phase detector configured to receive an input signal and a reference signal and generate a phase difference pulse signal that is varied in accordance with the oscillator tuning voltage;
- a loop filter having an input and an output; and
- a level shifter circuit coupled to an output of the phase detector and the loop filter input and configured to apply a level shift to the phase difference pulse signal such that the level shift is configured to compensate VCO gain and the loop filter averages the phase difference pulse signal to output provides an averaged signal to the VCO; and
- a logic inverter coupled to an output of the phase detector and an input of the level shifter circuit and configured to pre-compensate for a pulse inversion caused by the level shifter circuit;
- wherein the level shifter circuit comprises a transistor coupled to a resistive divider configured to set the level shift to be applied to the phase difference pulse signal.

18. A method of compensating in a phase locked loop, PLL, the method comprising:
- applying a reference voltage and a PLL feedback signal to a phase detector;
- outputting from the phase detector a phase difference pulse signal that is varied in accordance with the oscillator tuning voltage to a logic inverter and from the logic inverter to a level shifter, the logic inverter being configured to pre-compensate for a pulse inversion caused by the level shifter;
- inputting, to a voltage controlled oscillator, VCO, a level shifted representation of the phase difference pulse signal such that the level shift is configured to compensate VCO gain; and
- averaging by a loop filter the phase difference pulse signal to output an averaged signal to the VCO;
- wherein the level shifter comprises a transistor coupled to a resistive divider configured to set the level shift to be applied to the phase difference pulse signal.

* * * * *